United States Patent

Mizumura

[11] Patent Number: 5,444,386
[45] Date of Patent: Aug. 22, 1995

[54] PROBING APPARATUS HAVING AN AUTOMATIC PROBE CARD INSTALL MECHANISM AND A SEMICONDUCTOR WAFER TESTING SYSTEM INCLUDING THE SAME

[75] Inventor: Tsutomu Mizumura, Mitaka, Japan

[73] Assignee: Tokyo Seimitsu Co., Ltd., Tokyo, Japan

[21] Appl. No.: 5,330

[22] Filed: Jan. 15, 1993

[30] Foreign Application Priority Data

Jan. 17, 1992 [JP] Japan ............... 4-001302 U

[51] Int. Cl.⁶ .......................................... G01R 31/02
[52] U.S. Cl. ................................... 324/754; 324/158.1
[58] Field of Search ............... 324/158 P, 158 F, 72.5, 324/754, 751, 758, 761, 158.1, 762, 73.1

[56] References Cited

U.S. PATENT DOCUMENTS

| | | | |
|---|---|---|---|
| 3,654,585 | 4/1972 | Wickersham | 324/158 F |
| 3,866,119 | 2/1975 | Ardezzone et al. | 324/158 P |
| 4,099,120 | 7/1978 | Aksu | 324/158 P |
| 4,532,423 | 7/1985 | Tojo et al. | 324/751 |
| 4,567,432 | 1/1986 | Buol et al. | 324/158 P |
| 4,837,622 | 6/1989 | Whann et al. | 324/158 P |
| 4,864,227 | 9/1989 | Sato | 324/754 |
| 5,148,103 | 9/1992 | Pasiecznik, Jr. | 324/758 |
| 5,160,883 | 11/1992 | Blanz | 324/760 |
| 5,254,939 | 10/1993 | Anderson et al. | 324/754 |
| 5,304,922 | 4/1994 | Betz et al. | 324/754 |

FOREIGN PATENT DOCUMENTS

| | | |
|---|---|---|
| 63-280431 | 11/1988 | Japan . |
| 1-145586 | 6/1989 | Japan . |
| 1-206270 | 8/1989 | Japan . |
| 3-38848 | 2/1991 | Japan . |
| 3-220742 | 9/1991 | Japan . |

Primary Examiner—Ernest F. Karlsen
Attorney, Agent, or Firm—Nikaido Marmelstein Murray & Oram

[57] ABSTRACT

A probing apparatus including probes contacting with electrode pads of the semiconductor wafer for measuring a semiconductor wafer in which a probe card is safely and individually installed and a wafer testing system in which a plurality of probe cards are efficiently used are disclosed. A probing apparatus includes moving means 4 for receiving a card holder 2 accommodating a probe card 1, moving the card holder 2 into a position just below a pin socket 3 to which the probe card 1 is attached, and lifting the card holder 2, and attaching means 5 for attaching the probe card 1 to the pogo pin socket 3.

4 Claims, 6 Drawing Sheets

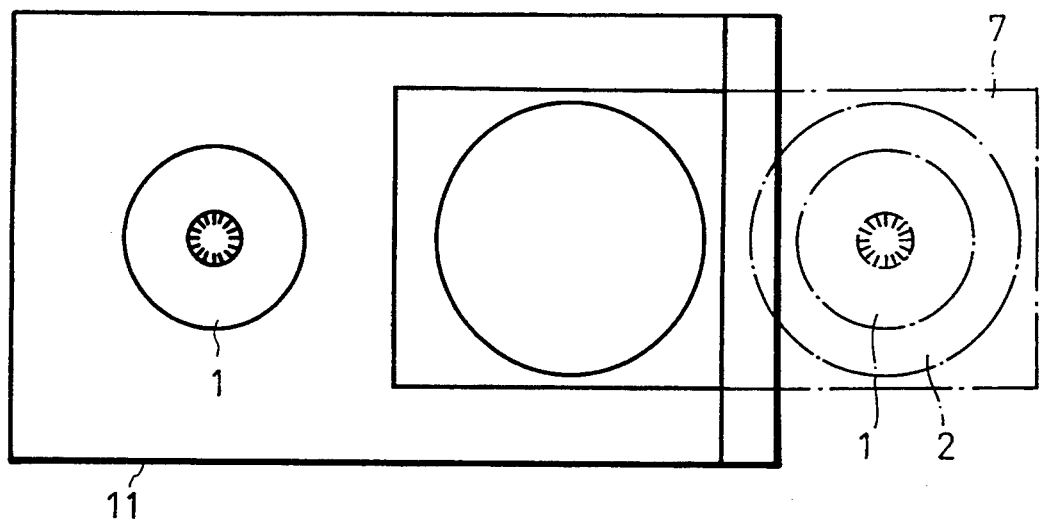
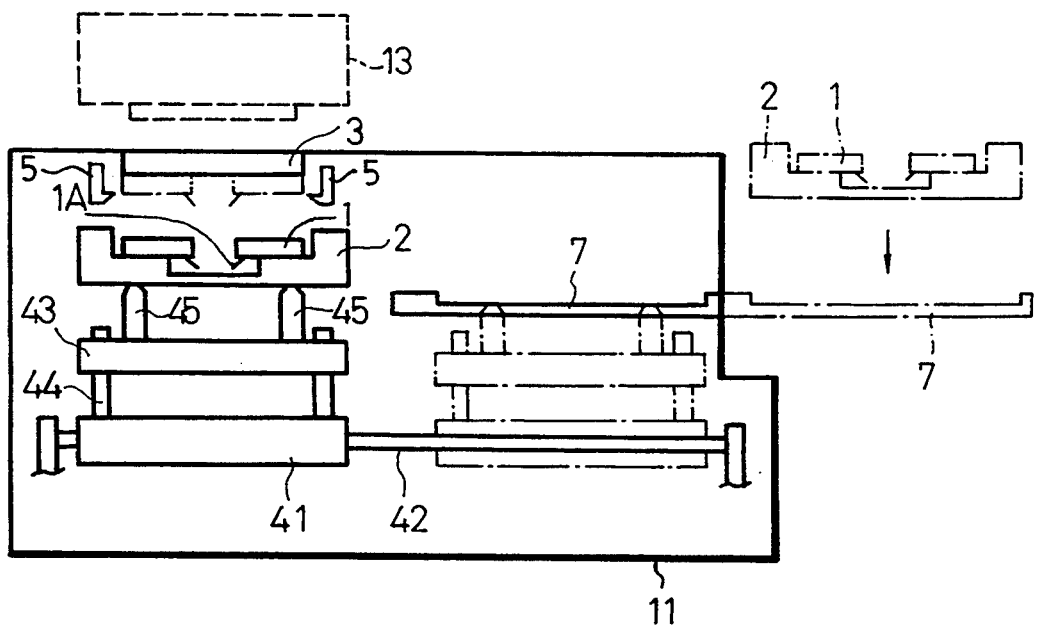

PROBING APPARATUS HAVING AN AUTOMATIC PROBE CARD INSTALL MECHANISM AND A SEMICONDUCTOR WAFER TESTING SYSTEM INCLUDING THE SAME

BACKGROUND OF THE INVENTION

1. Field of the Invention

The present invention relates to a probing apparatus for testing the electric characteristics of semiconductor chips formed on a semiconductor wafer by bringing probes for sending and receiving electric signals into contact with electrode pads of each semiconductor chip. In particular, the present device relates to a probing apparatus in which it is easy to replace a probe card with another one depending on a semiconductor wafer to be tested. The present device also relates to a semiconductor wafer testing system employing the probing apparatus.

2. Description of the Related Art

Semiconductor chips are usually formed by cutting a single crystal of silicon into a thin wafer, etching the surface of the wafer into circuit patterns, and cutting the wafer with a dicing machine into the chips. Before cutting the wafer on which the circuit patterns have been formed with the dicing machine, the electrical characteristics of the semiconductor chips on the wafer are tested by a probing apparatus, to check for defective chips. In the following, the test of the electrical characteristics of semiconductor chips formed on the wafer is called a test of electrical characteristics of the wafer or only a wafer test.

To test the electrical characteristics of a wafer, the probing apparatus uses a circular probe card having probes suitable for circuit patterns of chips formed on the wafer. The probe card is fixed to a pin socket such as a pogo (TM) pin socket, which is connected to a tester in the probing apparatus. The probes of the probe card are brought into contact with the wafer to test the wafer. The probe card may be changed with another one depending on the kind of wafer to be tested. According to a prior art, an operator must manually unfasten screws of the probe card to replace it with another one.

In this case, there is a risk of damaging probes of the probe cards while the operator is manually changing the probe cards with each other. Accordingly, there is a need for automating the wafer testing work. FIG. 1 shows a probing apparatus 11 proposed in Japanese Unexamined Patent Publication No. 63-280431. In FIG. 1, reference numeral 1 designates a probe card, reference numeral 4 designates a wafer chuck, reference numeral 9 designates a wafer, reference numeral 11 designates a probing apparatus within a casing, reference numeral 12 designates a probe card cassette, reference numeral 14 designates a wafer cassette, reference numeral 16 designates a control panel for controlling the probing apparatus. Actually, the wafer chuck 4 and the wafer cassette 14 etc., are not visible from outside, however, for convenience, they are shown as FIG. 1. A few of the other figures are also shown in this way. Further, in the figures, same portions are designated by the same reference numbers.

This probing apparatus 11 of FIG. 1 has a probe card cassette 12 for storing various kinds of probe cards 1 from among which one suitable for a semiconductor wafer to be tested is selected and automatically set.

The present applicant has proposed, in Japanese Unexamined Patent Publication No. 3-220742, an improvement in the above probing apparatus. This improvement uses a semiconductor wafer moving mechanism as the probe card moving mechanism, thereby realizing a simple structure. This semiconductor wafer moving mechanism includes a wafer chuck which holds the wafer by vacuum pressure.

In the probing apparatus shown in FIG. 1, there is no risk of damaging probes of the probe cards while the probe cards are being exhanged with each other because the operation is performed automatically. However, this probing apparatus has problems in that size of the apparatus becomes large and total efficiency of the use of the probe cards held in the cassette decreases.

In recent years, semiconductor devices are being integrated more and more and, therefore, probing apparatuses must carry out more complicated and time-cosuming tests of the semiconductor devices. The size of each semiconductor wafer is also increasing to improve productivity. Namely, the number of chips per wafer is increasing. This is another factor in elongating the testing time of each wafer.

The probing apparatus is designed to deal with various kinds of semiconductor wafers. In actual semiconductor production lines, however, the kinds of semiconductor wafers are not frequently changed from one to another. Namely, once a probe card is set, it will not to be replaced with another for a long time.

Actually, even in the probing apparatuses according to Japanese Unexamined Patent Publication Nos. 63-280431 and 3-220742, probe cards are not frequently switched from one to another. In this case, many probe cards held in the cassette are not used but are only stored for a long time.

Since it takes a long time to test a semiconductor wafer, a factory having a certain extent of production scale runs many probing apparatuses in parallel. If each of the probing apparatuses must store many probe cards, a great number of probe cards are not actually used, so the efficiency of use of the probe cards will be very low.

Further, each apparatus must be very large and complicated because it has to accommodate many probe cards although a great part of those probe cards are not used.

SUMMARY OF THE INVENTION

An object of the present invention is to realize a probing apparatus that has a simple structure, and is easy to attach a probe card to.

Further, another object of the present invention is to realize a semiconductor wafer testing system including the above probing apparatus in which probe cards used in this system can be efficiently used.

The probing apparatus according to the present invention tests the electrical characteristics of a semiconductor wafer by utilizing probes of a probe card suitable for the semiconductor wafer. The apparatus includes moving means for receiving a probe card, moving the probe card into a position just below a pin socket to which the probe card is attached, and lifting the probe card; and attaching means for attaching the probe card to the pin socket.

By only placing the probe card on the moving means of the probing apparatus, the moving means automatically transports and attaches the probe card to the pin socket. In this way, the probe card is quite simply set.

The apparatus uses one probe card at a time, to simplify its structure. The probe card is selected depending on a semiconductor wafer to be tested. It is not necessary to prepare extra probe cards.

A semiconductor wafer testing system according to the present invention includes a plurality of probing apparatuses; a probe card storing means for storing a plurality of probe cards commonly used in the probing apparatuses; an automated probe card moving means for picking out one of said probe cards stored in the probe card storing means and transporting the same to each probing apparatus; a control means for controlling the automated probe card moving means to pick out one of the probe cards corresponding to a kind of semiconductor wafer to be tested in one of the probing apparatus, and to transfer the same to a corresponding one of the probing apparatuses.

In the wafer testing system according to the present invention, the semiconductor wafers and the probe card suitable for the semiconductor wafers may be transported together, so that the probe card will be set before starting a test and the semiconductor wafers and probe card will be collected together after the test. This realizes an automated testing system that efficiently uses probe cards.

BRIEF DESCRIPTION OF THE DRAWINGS

The present invention will be more clearly understood from the description as set forth below with reference to the accompanying drawings, wherein:

FIGS. 2A and 2B are diagrams showing a first embodiment employing a tray pulled outside the apparatus casing to receive a probe card, FIG. 2A is a top view and FIG. 2B is a side view;

DESCRIPTION OF THE PREFERED EMBODIMENT

Figure 1:
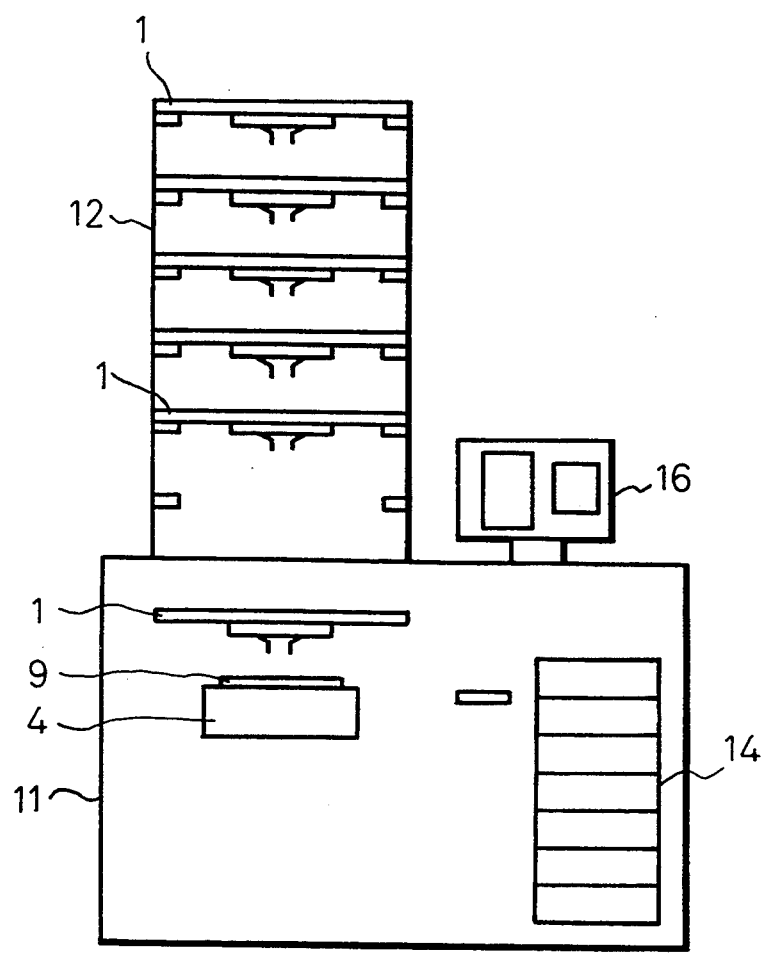
FIG. 1 is a diagam showing a probing apparatus of a prior art having many probe cards that are selected according to semiconductor wafers to be tested.

FIGS. 2A and 2B are diagrams showing a basic arrangement of a probing apparatus according to a first embodiment. Since the original function of the probing apparatus is to test the electrical characterristics of a semiconductor wafer, it naturally comprises mechanism for testing such characteristics. FIGS. 3A and 3B, however, do not show such mechanism because they do not directly relate to the present device.

In FIGS. 2A and 2B, reference numeral 1 designates a probe card, reference numeral 2 designates a card holder, reference numeral 3 designates a pin socket connected to a test head 13, and reference numeral 11 designates a probing apparatus within a casing. A probe card 1 has probes 1A suitable for a semiconductor wafer to be tested. The probe card 1 is connected to the pin socket 3. With the-probes 1A being in contact with the semiconductor wafer, the test head 13 applies signals to the semiconductor wafer according to a test program. The test head analyzes signals provided by the semiconductor wafer and determines the quality of each chip formed on the wafer.

The probe card 1 is circular and stored in the card holder 2. The card holder 2 with the probe card is placed on the tray 7 that has been pulled out of the probing apparatus casing. The tray 7 is pushed back to a predetermined position. The tray 7 may be operated manually, or automatically by a mechanism similar to a known tray mechanism for a compact disk.

Numerals 41 to 44 designate parts forming an XZ table. The horizontally moving base 41 moves along a horizontal shaft 42. The vertically moving base 43 moves along vertical shafts 44. The vertically moving base 43 is moved upward, and support rods 45 support the card holder 2 placed on the tray 7. The horizontally moving base 41 is then moved into a position just below the pin socket 3. The vertically moving base 43 is moved upward further, so that the probe card 1 is pushed against the pin socket 3 and fixed by clamps 5. At this time, the pins are compressed.

Figure 3:
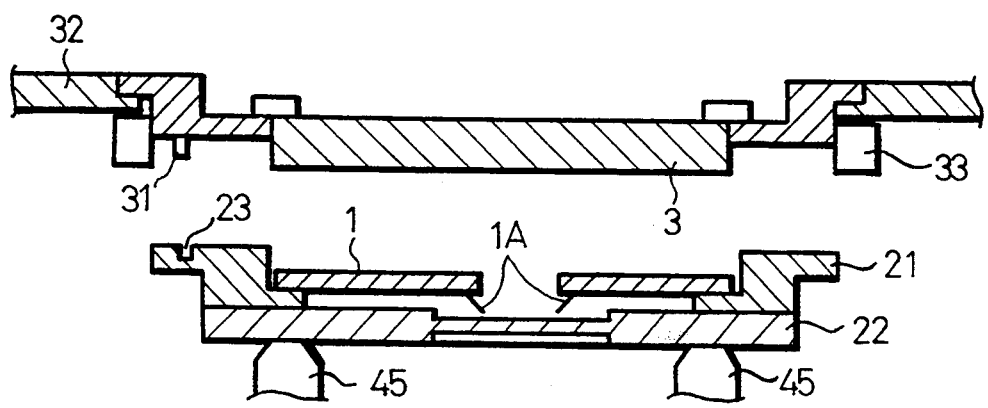
FIG. 3 is a diagram showing contact portions between a probe card and a pin socket of the embodiment of FIGS. 2A and 2B, and a state before the probe card is attached to the pogo pin socket.

FIG. 3 is a sectional view showing the details of contact positions between the probe card 1 and the pin socket 3. The card holder 2 comprises an annular holder 21 and a carrier 22. The center part of the card holder is recessed so as not to damage the probes 1A. The holder 21 has a reference-hole 23 for correctly connecting the probe card 1 with the pin socket 3. The reference hole 23 engages with a reference pin 31 formed on a frame 32, which is attached to the pogo pin socket 3.

Figure 4:
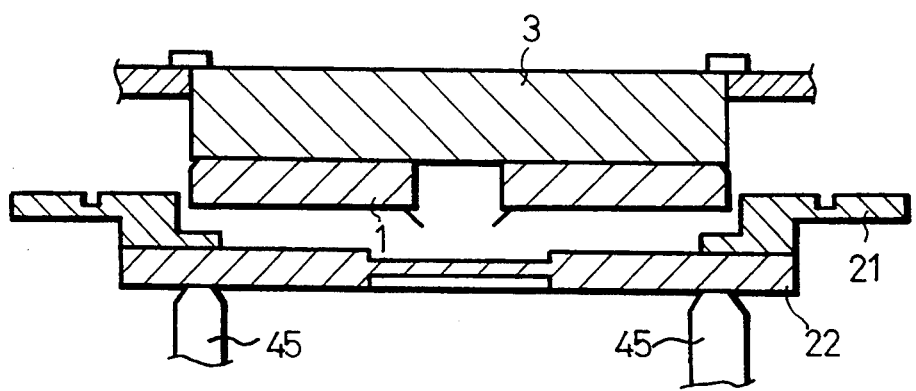
FIG. 4 is a diagram showing a state of FIG. 3 when the probe card is attached to the pogo pin socket.

According to this embodiment, the probe card 1 is held in a condition attached to the pin socket 3 with the clamps 5 shown in FIG. 2B. Actually, the clamps 5 are composed of three or four rod elements which move in horizontal directions through vacant spaces of the card holder 2. However, in FIGS. 3 and 4, the clamps 5 are not shown because they exist in other spaces different from the cross-section of FIGS. 3 and 4. The reference pin 31 is engaged with the reference hole 23, the carrier 22 is pushed upward to press the probe card 1 against the pogo pin socket 3, and the clamps 5 are locked. FIG. 4 shows a portion of the view shown in FIG. 3 after the probe card 1 is attached to the pin socket 3.

To replace the probe card 1 with another card, the probe card 1 must be removed from the pin socket 3 and taken outside. Since the probe card 1 is in contact with the pin socket 3 through the pins, the probe card 1 may easily be removed from the pin socket 3 only by unfastening the clamps 5. Only by releasing the clamps 5, the probe card 1 is detached. At this time, the holder 21 is at a predetermined ascended position to receive the removed probe card 1. The holder 21 and probe card are taken outside along a route opposite to the probe card attaching route, and a new probe card is attached in a manner mentioned above.

According to this embodiment, the probe card 1 is brought into contact with the pin socket 3 through the pins and fixed together by the clamps. The clamps may be substituted by, for example, a chucking mechanism using contact pressure.

Figure 5:
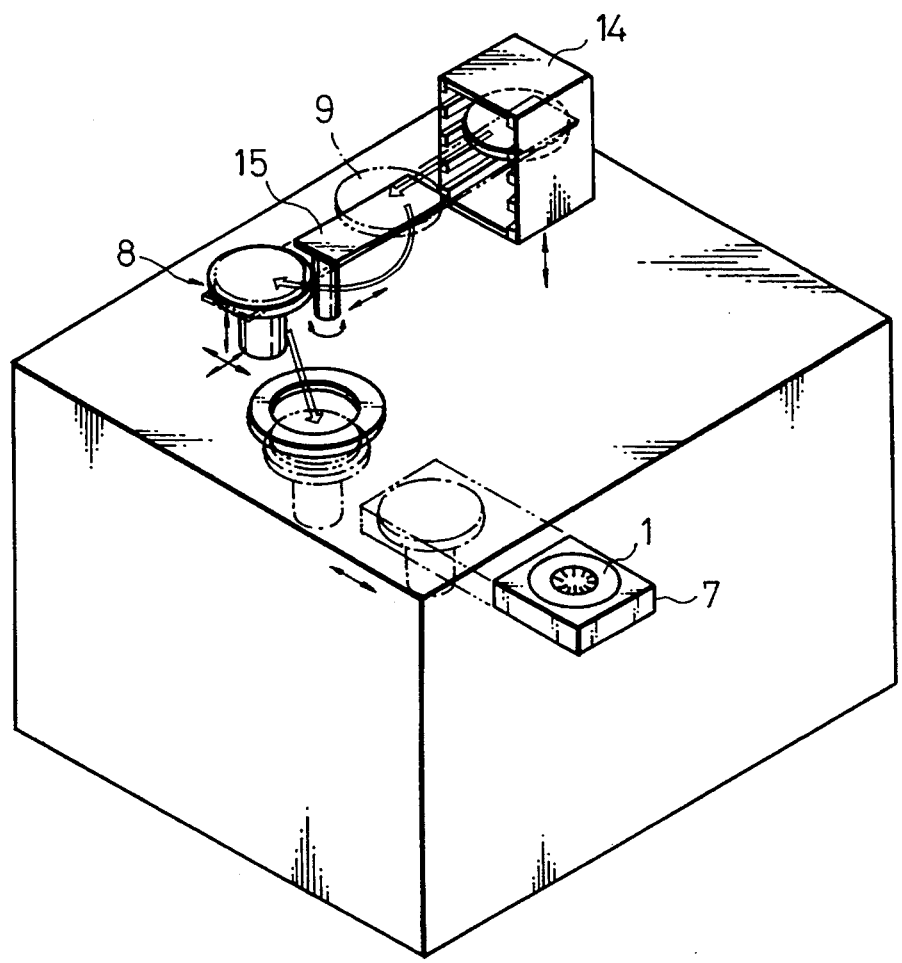
FIG. 5 is a diagram showing a second embodiment employing a shared wafer chuck, for moving a probe card.

The moving means for setting a probe card of the above embodiment is provided as an independent mechanism. A wafer chuck used for transporting a semiconductor wafer to be tested may be commonly used as the mechanism for moving a probe card. This technique realizes a compact and a simple probing apparatus. FIG. 5 shows such a second embodiment employing the wafer chuck.

In FIG. 5, reference numeral 14 designates a wafer cassette for storing semiconductor wafers to be tested. The wafer cassette is externally prepared, and collected after a test. Each semiconductor wafer 9 stored in the wafer cassette 14 is picked up by an insertion/discharged mechanism 15 from the wafer cassette 14 and placed on a wafer chuck 8. The wafer chuck 8 holds the semiconductor wafer 9 by vacuum and moves the same into a position below a pin socket to which a probe card 1 is attached. In practice, probes of the probe card are positioned on the semiconductor wafer and brought into contact with electrode pads of the chips on the wafer with the use of a microscope. Then, a test is carried out.

According to this embodiment, the probe card 1 is held in a card holder 2, which is placed in a tray 7 and moved to the position shown. The wafer chuck 8 is moved for a distance to the position and holds the card holder 2. An XYZ table is usually used for moving the wafer chuck 8. The XYZ table must have a large moving range to cover the distance. This technique enables many parts to be commonly used and, therefore, is advantageous in terms of size and cost.

Figure 6:
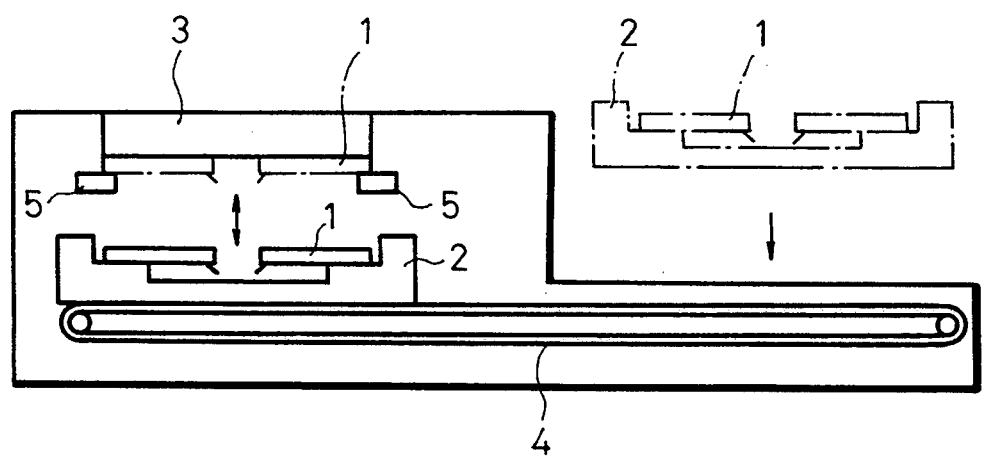
FIG. 6 is a diagram showing a third embodiment which does not have the tray shown in FIG. 2A and 2B, and in which the probe card is directly placed on the wafer chuck.

In the first and second embodiments, the probe card is installed by being set on the tray that has been pulled out. However, the probe card can be directly set on the moving mechanism of the probe card from the outside of the apparatus. FIG. 6 shows a third embodiment in which the card holder is disposed on the moving mechanism of the probe card.

In FIG. 6, reference numeral 4 designates a probe card moving mechanism. The probing apparatus shown in FIG. 6 has a large space in an upperside of a position on which the card holder 2 is set, therefore, the total size of the apparatus becomes large in comparison with one including the tray shown in FIG. 2. However, this apparatus becomes more simple because the tray mechanism is not provided.

As mentioned before, a factory having a certain extent of production scale employs many probing apparatuses in parallel for testing semiconductor wafers. Such a factory employs robots for automating the supply and discharge of semiconductor wafers to be tested. In this case, the semiconductor wafers are stored and transported in the wafer cassette 14 shown in FIG. 5. A probe card suitable for the semiconductor wafers is selected according to the type of semiconductor wafers to be tested. Then, the selected probe card is installed in the probing apparatus by manually inserting it in apparatuses of the prior art. Therefore, occassionally the probes of the probe cards are damaged when the operator is manually changing the probe card.

Figure 7:
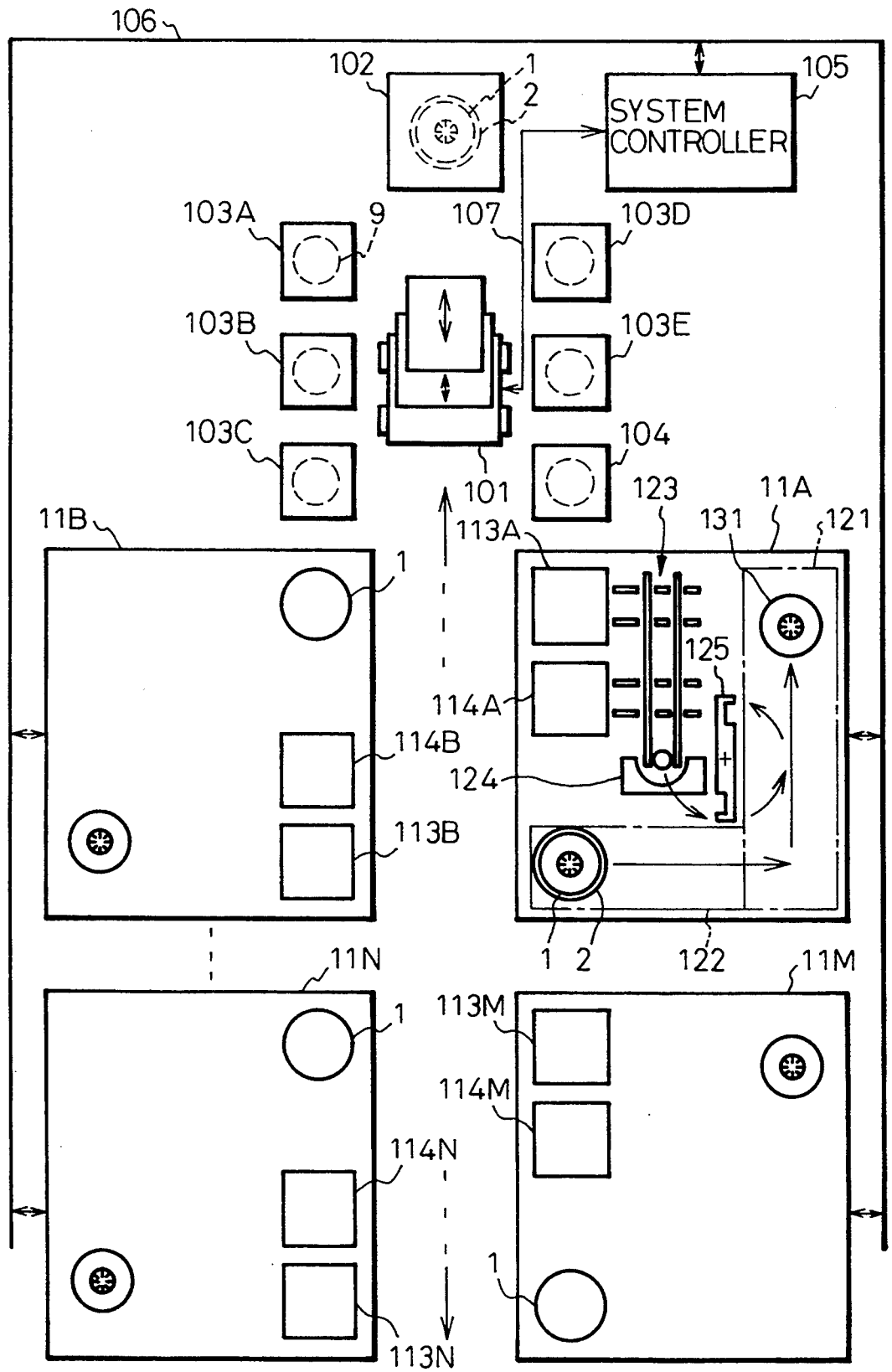
FIG. 7 is a diagram showing an embodiment of a semiconductor wafer testing system according to the present invention including a plurality of probing apparatuses used in parallel.

FIG. 7 is a diagram illustrating an arrangement of a wafer testing system of the fourth embodiment according to the present invention which includes a plurality of probing apparatuses. In FIG. 7, reference numeral 11A, 11B, ..., 11M, 11N designate probing apparatuses described in the third embodiment, reference numeral 101 designates a robot for supplying semiconductor wafers and probe cards, reference numeral 102 designates a probe card cassette, reference numeral 103A to 103E designate wafer cassettes storing untested wafers, reference numeral 104 designates a wafer cassette storing tested wafers, and reference numeral 105 designates a system controller. Each probing apparatus and the system controller 105 are connected with a control signal cable 106, and the robot 101 and the system controller 105 are connected with a control cable 107.

The probe card cassette 102 stores many probe cards commonly used in this system. The wafer cassettes 103A to 103E are supplied manually or by an automated supply system, and the wafer cassette 104 is instantly moved away when it is collected.

In each probing apparatus, two wafer cassettes 113A and 114A are set, one of these cassettes stores untested wafers, and the other stores tested wafers. In this case, the cassette 113A stores untested wafers and the cassette 114A stores tested wafers. One untested wafer is pulled out from the cassette 113A by the wafer moving mechanism 123, and it moves to position of a stopper 124. The wafer is transported on a wafer chuck by a rotating mechanism 15 shown in FIG. 5. Reference numeral 121 designates an XZ moving mechanism of the wafer chuck. The tested wafer moves back to the casette 114A along a route opposite to the wafer card supplying route. Reference numeral 122 designates a probe card moving mechanism which moves the probe card between a setting position by the robot 101 and a transfer position to the wafer moving mechanism 121. Namely, the wafer moving route is included as a part of the probe card moving route. When the probe card is changed, the probe card is separated from the pin cassette and is moved along a route opposite to the supplying route.

In the following, operations to supply the wafer cassettes and the probe cards to each probing apparatus are described.

When tests of all wafers stored in the wafer cassette such as a cassette 113A of the probing apparatus 11A are finished and those wafers are stored in the cassette 114A, the robot 101 moves to the position of the cassette 114A and holds it. Then, the robot 101 carries it to the position shown by the reference numeral 104 and sets it.

When wafers to be tested are different from those tested just before, the probe card provided in the probing apparatus 11A cannot be used for testing the new wafers. Therefore, the probe card is required to be changed to one corresponding to the new wafers.

At first, the card holder held at a waiting position on the probe card moving mechanism 122 is moved to a position just below the probe card attached to the pin socket of the probing apparatus 11A, and the probe card is separated from the pogo pin socket. In this way, the probe card is held in the card holder. Then, the card holder is transported to the position at which the card holder is transferred to the robot 101. The robot 101 receives the card holder and stores it at a predetermined position of the probe card cassette 102.

Next, the robot 101 receives a card holder including the new probe card corresponding to the new wafer to be tested, and the robot 101 transports it to the position the card holder is transferred to the probing apparatus 11A. In the probing apparatus 11A, the card holder is transported to the position just below the pin socket, and the probe card is attached to the pin socket. The card holder is moved back to the waiting position.

The robot 101 receives the wafer cassette including the new wafers to be tested and transports it to a position corresponding to the wafer cassette 114A. Namely, the wafer cassette storing untested wafers is changed from the cassette 113A to 114A. In this way, only one cassette is required to be changed when all wafers in the cassette are tested.

As described above, in this embodiment, the semiconductor wafers and the probe card suitable for the semiconductor wafers may be transported together, so that the probe card will be set before starting a test and the semiconductor wafers and probe card will be collected together after the test. This realizes an automated testing system that efficiently uses probe cards. The probing apparatus according to the present invention is suitable for such an automated system because it can set a probe card by only placing a probe holder accommodating the probe card.

I claim:

1. A probing apparatus arrangement comprising a plurality of probing apparatuses (11A-11N) for measuring electrical characteristics of a plurality of semiconductor wafers (9) by bringing probes of a probe card (1) suitable for each semiconductor wafer into contact with electrode pads of the respective wafer to be tested, wherein each probing apparatus comprises moving means (41-45) for receiving a probe card (1), for carrying said probe card to a position just below a pin socket (3) to which the probe card is to be attached, and for lifting said probe card, and attaching means (5) for attaching the lifted probe card to said pin socket, said apparatus arrangement further comprising:

a probe card storing means (102) for storing a plurality of probe cards (1), each in a probe card holder (2), to be commonly used in said plurality of probing apparatuses;

an automated probe card transporting means (101) for picking out one of said probe cards stored in said probe card storing means (102) and transporting the same to a respective probing apparatus (11A); and a control means (105) for controlling said automated probe card transporting means (101) to pick out from said probe card storing means (102) one of said probe cards corresponding to a kind of semiconductor wafer to be tested in said respective probing apparatus (11A) and to transfer the same to the moving means (41-45) of said respective probing apparatus (11A).

2. A probing apparatus arrangement as set forth in claim 1 further comprising:

a plurality of untested wafer cassettes (103A-103E); and wherein said control means (105) operates to control said automated probe card transporting means (101) to pick out untested wafers from said untested wafer cassettes and to transfer the same to respective probing apparatuses to be tested.

3. A probing apparatus arrangement as set forth in claim 1 wherein each probe card (1) transported to a respective probing apparatus is transported in a state wherein it is accommodated in a probe card holder (2); and each probing apparatus includes a tray (7) movable between a position inside a casing of said apparatus and a position outside said casing of the apparatus to receive said probe card and move the same onto said moving means (41-45).

4. A probing apparatus arrangement as set forth in claim 2, wherein said moving means (41-45) in each probing apparatus (11A-11N) includes a wafer chuck (8) which is also used for transporting a semiconductor wafer to be tested by the probing apparatus.

* * * * *